United States Patent
Pfeilschifter et al.

(10) Patent No.: US 12,214,674 B2
(45) Date of Patent: Feb. 4, 2025

(54) METHOD FOR DETECTING AN INSULATION FAULT IN A VEHICLE ON-BOARD ELECTRICAL SYSTEM AND VEHICLE OVERVOLTAGE PROTECTION CIRCUIT

(71) Applicant: Vitesco Technologies GmbH, Regensburg (DE)

(72) Inventors: Franz Pfeilschifter, Munich (DE); Reinhard Weinzierl, Munich (DE)

(73) Assignee: VITESCO TECHNOLOGIES GBMH, Regensburg (DE)

(*) Notice: Subject to any disclaimer, the term of this patent is extended or adjusted under 35 U.S.C. 154(b) by 63 days.

(21) Appl. No.: 18/011,387

(22) PCT Filed: Jun. 10, 2021

(86) PCT No.: PCT/EP2021/065717
§ 371 (c)(1),
(2) Date: Dec. 19, 2022

(87) PCT Pub. No.: WO2021/259665
PCT Pub. Date: Dec. 30, 2021

(65) Prior Publication Data
US 2023/0264571 A1    Aug. 24, 2023

(30) Foreign Application Priority Data

Jun. 25, 2020 (DE) .................... 10 2020 207 878.5

(51) Int. Cl.
B60L 3/00 (2019.01)
B60R 16/03 (2006.01)
(Continued)

(52) U.S. Cl.
CPC ............ B60L 3/0069 (2013.01); B60R 16/03 (2013.01); G01R 19/10 (2013.01); G01R 19/12 (2013.01); G01R 27/025 (2013.01)

(58) Field of Classification Search
CPC ....... B60L 3/0069; B60R 16/03; G01R 19/10; G01R 19/12; G01R 27/025
(Continued)

(56) References Cited

U.S. PATENT DOCUMENTS 8,878,547 B2    11/2014 Herraiz et al.
9,891,262 B2    2/2018 Kullick et al.
(Continued)

FOREIGN PATENT DOCUMENTS

DE    102012219563 A1    5/2013
DE    102013226595 A1    6/2015
(Continued)

OTHER PUBLICATIONS

Bender ISO685, Insulation Monitoring, 2021 (https://www.bender-uk.com/know-how/technology/it-system/insulation-monitoring/) (Year: 2021).*

(Continued)

*Primary Examiner* — Huy Q Phan
*Assistant Examiner* — Trung Q Nguyen
(74) *Attorney, Agent, or Firm* — Buchanan Ingersoll & Rooney PC

(57) ABSTRACT

A method for detecting an insulation fault in a vehicle on-board electrical system having an HV and LV on-board electrical system branches. The LV branch has at least one first LV potential and a second LV potential that differs therefrom and corresponds to a ground potential of the vehicle on-board electrical system. The HV branch has positive HV negative HV potentials. These HV potentials are DC-isolated from the LV branch potentials. An insula-
(Continued)

tion fault between at least one of the HV potentials and the first LV potential is detected by identifying a current flow. The current flow runs through a voltage limiting circuit connected between the ground potential and the first LV potential. This circuit connects the first LV potential, via a plurality of diodes, to a voltage limiting element connected to the ground potential of the vehicle on-board electrical system. A vehicle overvoltage protective circuit is also described.

11 Claims, 1 Drawing Sheet

(51) Int. Cl.
  *G01R 19/10* (2006.01)
  *G01R 19/12* (2006.01)
  *G01R 27/02* (2006.01)
(58) Field of Classification Search
  USPC .................................. 324/425–434
  See application file for complete search history.

(56) References Cited

U.S. PATENT DOCUMENTS

| 2002/0130643 | A1 | 9/2002 | Binder et al. |
| 2010/0308841 | A1* | 12/2010 | Karrer ................... G01R 27/18 324/123 R |
| 2014/0084935 | A1 | 3/2014 | Chatroux et al. |
| 2018/0154776 | A1* | 6/2018 | Gardien ................. G01R 31/52 |
| 2019/0184833 | A1* | 6/2019 | Elshaer ................. B60L 3/0069 |
| 2021/0148993 | A1* | 5/2021 | Takamatsu ............ G01R 31/12 |
| 2023/0018999 | A1* | 1/2023 | Boehme ................. B60L 53/11 |
| 2024/0100956 | A1* | 3/2024 | Stang ................... B60L 3/0046 |

FOREIGN PATENT DOCUMENTS

| DE | 102014223486 A1 | 5/2016 |
| DE | 102016106776 A1 | 10/2016 |
| KR | 10-2014-0041621 A | 4/2014 |

OTHER PUBLICATIONS

International Search Report and Written Opinion for International Application No. PCT/EP2021/065717, mailed Oct. 13, 2021, 9 pages.
International Search Report and Written Opinion for International Application No. PCT/EP2021/065717, mailed Oct. 13, 2021, 14 pages (German).
German Examination Report for German Application No. 10 2020 207 878.5, dated Mar. 1, 2021 with translation, 8 pages.
Office Action (Notice to Submit Response) issued Nov. 4, 2024, by the Korean Intellectual Property Office in corresponding Korean Patent Application No. 10-2023-7001678 and an English translation of the Office Action. (14 pages).

* cited by examiner

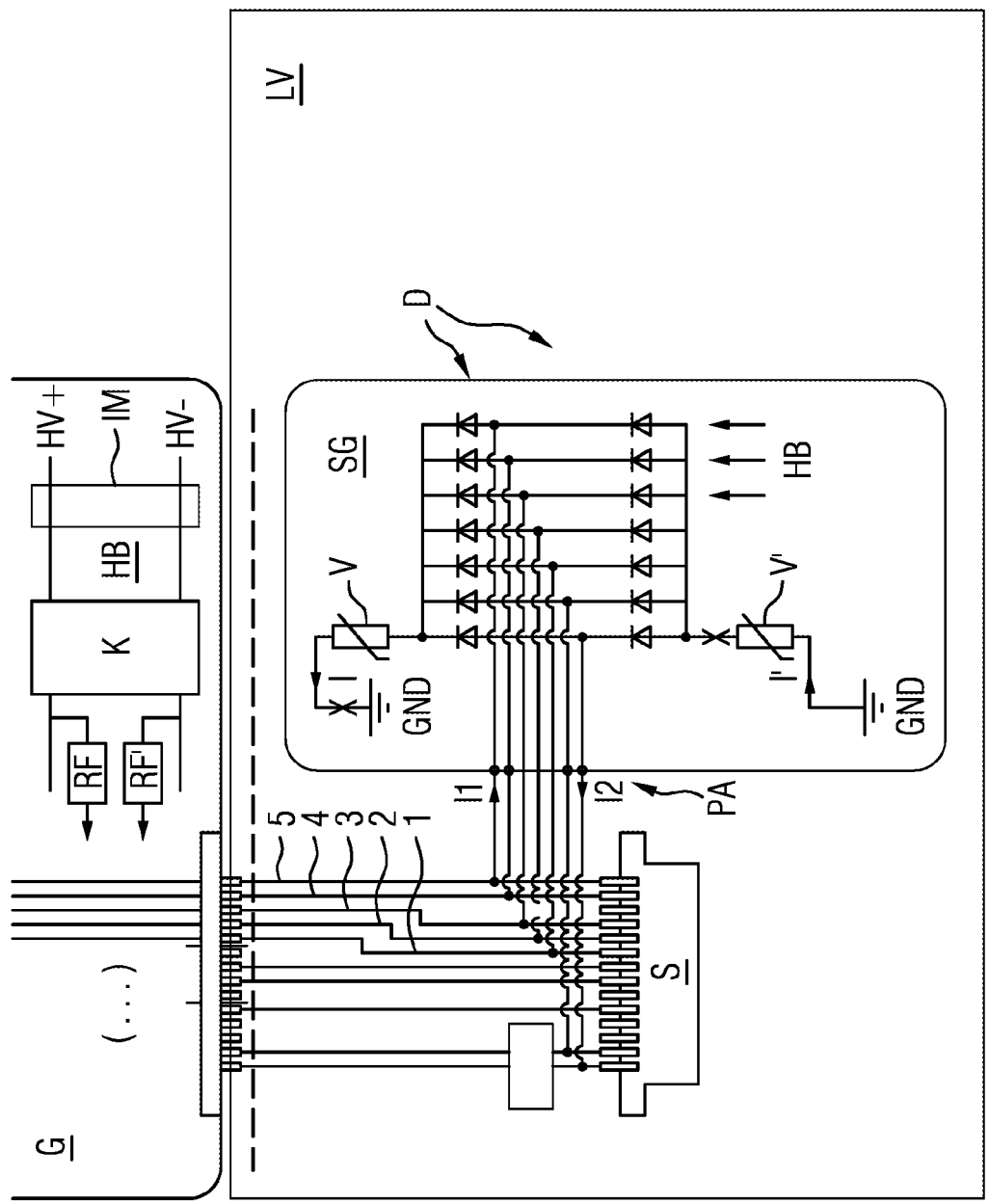

METHOD FOR DETECTING AN INSULATION FAULT IN A VEHICLE ON-BOARD ELECTRICAL SYSTEM AND VEHICLE OVERVOLTAGE PROTECTION CIRCUIT

CROSS REFERENCE TO RELATED APPLICATIONS

This application is the U.S. National Phase Application of PCT International Application No. PCT/EP2021/065717, filed Jun. 10, 2021, which claims priority to German Patent Application No. 10 2020 207 878.5, filed Jun. 25, 2020, the contents of such applications being incorporated by reference herein.

BACKGROUND OF THE INVENTION

It is known practice to equip vehicles with an electrical drive or other electrical components. In order to achieve high powers, particularly for traction, use is made of high voltages, for example of 400 volts or more, which, in contrast to the otherwise customary 12 volt on-board electrical systems, can pose a risk to people.

For this reason, vehicles that have a high-voltage on-board electrical system (i.e. a high-voltage on-board electrical system—HV on-board electrical system) are provided with insulation that electrically separates the HV on-board electrical system from the rest of the on-board electrical system and the ground potential, in particular from the vehicle chassis.

Since a fault in the insulation can result in a contact voltage that is harmful, if not fatal, to humans, further mechanisms for monitoring this insulation are provided. Such insulation monitoring captures the two HV potentials of the HV electrical system with respect to ground in order to thus determine insulation resistances with respect to ground (chassis). However, if there is a high-impedance insulation fault, part of the low-voltage on-board electrical system can be connected to a dangerous HV potential without being detected.

SUMMARY OF THE INVENTION

It is an aspect of the invention to show a possibility with which an insulation fault between an HV on-board electrical system branch and a low-voltage on-board electrical system branch (LV on-board electrical system branch) can be detected, especially if the insulation fault has a high impedance, in order to therefore allow further protective measures.

It is proposed to provide a voltage limiting circuit in the LV on-board electrical system branch (corresponding to a low-voltage on-board electrical system branch) so that a current flow through this circuit indicates that an HV potential is connected to a supply potential of the LV on-board electrical system branch. For example, a communication, control or sensor component or line (of an LV on-board electrical system branch) can come into contact with an HV potential due to an insulation fault. However, depending on the component, it may burn out with no noticeable or monitored current flow, with the result that, although the LV potential does not come into contact with the rest of the LV on-board electrical system branch due to the burnt-out component, a line or another component of the LV on-board electrical system carries the HV potential. The voltage limiting circuit therefore provides a dedicated and reliable element which causes a detectable and reliable current flow if an HV potential comes into contact with the potential of the LV on-board electrical system branch due to insulation faults.

If, for example, a line of a low-voltage sensor device (or of another LV device) that is connected to the LV on-board electrical system branch comes into contact with an HV potential due to an insulation fault, for example an input stage (more generally: data or measurement interface) of the sensor device, to which the sensor line is connected, may burn out unnoticed, with the result that there is no current flow between the HV on-board electrical system branch and the LV on-board electrical system branch. However, the sensor line remains at the HV potential due to the insulation fault and there is also no detectable current flow due to the burnt-out input stage. An HV potential could then reach other components via this sensor line, in particular since the sensor device and its line are not designed for high-voltage applications and therefore also have no appropriate insulation. The same applies to communication or control devices of the LV on-board electrical system branch and their interface.

For safeguarding, each LV component or LV line or each LV potential should preferably be connected to the ground potential via a voltage limiting circuit. In order to reduce the number of voltage limiting elements required, it is proposed to connect at least one of the lines or potentials or components that are to be protected to a voltage limiting element via a plurality of diodes. The voltage limiting element is connected to the ground potential of the vehicle on-board electrical system. The diodes therefore form a network that allows a plurality of potentials that are to be protected to be connected to the same voltage limiting element (or to the same two voltage limiting elements). As a result, a plurality of LV potentials can be protected using the same voltage limiting element. This results in advantages in terms of cost and structural space, since diodes are cheaper and smaller than voltage limiting elements, in particular in a configuration for a peak load of several amperes or several 100 amperes.

The method proposed here makes it possible to generate a current flow in a targeted manner using the voltage limiting circuit for numerous LV potentials in a cost-effective way, which current flow does not depend on the burn-out behavior, for example, of a (data) interface of a sensor device, of an interface of a communication device or of a control device or on other elements of the LV on-board electrical system branch when an HV potential reaches this. The voltage limiting circuit allows a current flow to be identified in a detectable and reliable manner for numerous LV potentials, which current flow indicates that an HV potential has been applied to a component of the LV on-board electrical system branch.

In particular, the voltage limiting circuit can be easily adapted to the voltage of the HV on-board electrical system, wherein this is not automatically the case for LV components. The procedure described here makes it possible in particular to identify when an HV potential is applied to a component of the LV on-board electrical system branch (e.g. a control, communication or sensor component), even if no detectable current is flowing due to the insulation fault. For example, an active measurement of the insulation resistance would not reliably detect such a sensor error, especially if the connection between the line connected to the LV component (low voltage) and the rest of the LV on-board electrical system branch is lost due to a component part in the LV component burning out. The terms LV component and LV device (e.g. in control, communication or sensor devices) are synonyms here. In particular, the circuit used itself represents protection against overvoltage, since the current flowing in the event of an overvoltage causes the overvoltage to be suppressed.

A method for detecting an insulation fault in a vehicle on-board electrical system is therefore described. In this case, the vehicle on-board electrical system has an HV on-board electrical system branch and an LV on-board electrical system branch. The HV on-board electrical system branch can also be referred to as a high-voltage on-board electrical system branch. The LV on-board electrical system branch can also be referred to as a low-voltage on-board electrical system branch. The prefix "high-voltage" or "HV" defines components or on-board electrical system branches or sections thereof that work with operating voltages of more than 60 volts, in particular at least 200, 400, 600, 800 or 100 volts. These pose a danger to people if they come into contact with the operating voltage. The prefixes "LV" and "low-voltage" are synonymous and mean an operating voltage of less than 60 volts, in particular, for example, 12 to 14 volts, essentially 24 volts or essentially 48 volts. These operating voltages do not require any special measures to avoid contact with the operating voltage in question.

The LV on-board electrical system branch can have a positive supply potential and a negative supply potential. The LV on-board electrical system branch has at least one first LV potential (a signal potential or a positive supply potential or another) and a second, negative LV potential that is different thereto. In particular, the second LV potential corresponds to a ground potential of the vehicle on-board electrical system. The first LV potential can be a positive potential. For a signal potential, the mathematical sign depends on the signal waveform, such that the first potential can be a positive or a negative potential (with respect to the ground potential), or may not be assigned a specific mathematical sign.

The HV on-board electrical system branch has a positive HV potential and a negative HV potential. These potentials are DC-isolated from the potentials of the LV on-board electrical system branch. An insulation fault between at least one of the HV potentials and the first LV potential is detected by a current flow through a voltage limiting circuit being identified. The current flow can be derived from another (electrical) variable or can be measured. The voltage limiting circuit is connected between the ground potential and the at least one first LV potential. The at least one first LV potential is connected to a voltage limiting element via a plurality of diodes D. The voltage limiting element is connected to the ground potential of the vehicle on-board electrical system (that is to say to the second LV potential of the LV on-board electrical system).

The negative supply potential corresponds to a ground potential of the vehicle on-board electrical system, in particular the chassis potential. The HV on-board electrical system branch has a positive and a negative HV potential. These two HV potentials are DC-isolated from the potentials of the LV on-board electrical system branch. This DC isolation is based in particular on (electrical) insulation, wherein it is described here how a fault in this insulation can be detected. The HV potentials are not related to the ground potential in order to therefore avoid a dangerous current upon contact.

An insulation fault between at least the HV potentials and one of the LV potentials, in particular the first LV potential, is detected. In this case, an LV potential that is positive (or negative) with respect to ground is referred to as first LV potential, as are potentials that are not ground, for instance signal potentials such as control, data or measurement signals.

The HV potentials are supply potentials. The first LV potential can be a positive LV supply potential, but can also be a potential of a conductor, for example of a sensor, communication or control conductor, or of another component.

The insulation fault is detected by identifying a current flow through a voltage limiting circuit. This voltage limiting circuit is connected between the ground potential and the first LV potential (that is to say the potential to be monitored). The voltage limiting circuit is configured not to conduct below a breakdown voltage and to conduct above this voltage. As a result, the current flow indicates an excessively high voltage, i.e. a voltage above a breakdown voltage of the voltage limiting circuit.

This breakdown voltage is greater than the maximum operating voltage or nominal voltage of the LV on-board electrical system branch, with the result that a current flow only occurs when the first LV potential has an excessively high voltage with respect to ground. In this case, an excessively high voltage is a voltage that is above the breakdown voltage, in particular that is above a predefined value or above the maximum operating voltage of the LV on-board electrical system branch. Since the voltage limiting circuit is equipped with specific features, namely a current flow above a certain breakdown voltage, while components or devices such as sensor evaluation circuits, communication circuits, control circuits and the like, for example, do not necessarily have these features, the voltage limiting circuit can be used to reliably identify an excessively high voltage at the first LV potential even if otherwise no current flows from the HV on-board electrical system branch to ground, that is to say even if the fault cannot be clearly identified by active insulation resistance measurement. In particular, the interfaces in question, which are used to connect a line to the component in question, do not have a reliable behavior in the event of overvoltage, especially since these are also designed for a low voltage (<60 V).

The current flow can be identified by detecting a current flow through the voltage limiting element. In this case, in particular the current that flows through the voltage limiting element is measured, or a variable from which the current can be derived or that is characteristic of the intensity of the current. For a multiplicity of first LV potentials, it will be necessary to measure the current intensity through the voltage limiting element (jointly connected downstream of the first LV signals) that is connected downstream of the first LV potentials via diodes. Therefore, insulation faults in a plurality of first LV potentials can be identified using only a measuring apparatus that is assigned to the voltage limiting element and that can directly or indirectly determine the current through the voltage limiting element. Preferably, a respective voltage limiting element is provided for both polarities, with the result that the first LV potentials are connected to the ground potential via a first group of diodes and a first voltage limiting element connected downstream of this group, and are connected to the ground potential via a second group of diodes and a second voltage limiting element connected downstream of this group, wherein the first and the second group of diodes have opposing diode directions. The two groups cover the two possible polarities of the overvoltage.

The current flow can also be identified by detecting a current flow through the voltage limiting circuit, wherein the plurality of diodes thereof comprise at least two diodes that connect the at least one first LV potential to the voltage limiting element in opposing directions. The diodes can be assigned to the differently oriented groups (wherein each diode is only assigned to one group and the diodes are assigned to different groups).

The current flow can be identified by detecting a current flow through the voltage limiting circuit. A first voltage limiting element is connected to a plurality of first LV potentials via a plurality of first diodes (diodes of a first group, for example). A second voltage limiting element is connected to the plurality of first LV potentials via a plurality of second diodes (diodes of a second group, for example). The first diodes are connected to the ground potential in one direction, wherein the second diodes are connected to the ground potential in a direction opposite thereto.

In other words, a multiplicity of first LV potentials (potentials of control signals, sensor signals or communication signals) can be connected to voltage limiting elements via a rectifier circuit provided by diodes, which voltage limiting elements connect the rectifier circuit to the ground potential. The rectifier circuit is a full-wave rectifier circuit. The rectifier circuit has an AC side that is connected to the first LV potentials. The rectifier circuit has a DC side with two connections, a positive and a negative connection, wherein the positive connection is connected to the ground potential via a first voltage limiting element and the negative connection is connected to the ground potential via a second voltage limiting element. The rectifier circuit provides a half-bridge for each first potential. First ends and second ends of the half-bridges are connected to one another, and are also connected to ground via a respective voltage limiting element. In the event of positive overvoltage in one of the first potentials, the rectifier circuit dissipates a current to ground via a first voltage limiting element. In the event of negative overvoltage in one of the first LV potentials, the rectifier circuit dissipates a current to ground via a second voltage limiting element. In the event of positive overvoltage, all the first potentials discharge said overvoltage to ground via a first voltage limiting element. In the event of negative overvoltage, all the first LV potentials discharge said overvoltage to ground via a second voltage limiting element. The two voltage limiting elements are used to dissipate the overvoltage of all the LV potentials (or a subgroup thereof).

One embodiment provides for the current flow to be identified on the basis of a shift of one of the HV potentials with respect to the ground potential. This is determined, for example, by a passive voltage measurement of the HV potentials with respect to the ground potential. In this case, only one HV potential can also be measured with respect to the ground potential. In particular, an HV potential can be determined by capturing the voltages between the HV potentials and by subtracting the voltage between the other HV potentials and ground potential.

The voltage limiting circuit uses the current flow to generate a shift of at least one of the HV potentials with respect to ground potential in a targeted manner if there is an insulation fault between an HV potential and a positive LV potential. In the absence of a voltage limiting circuit, this would depend on the property of the LV component where the first LV potential is provided, in particular whether this component generates a reliable current flow in the event of overvoltage at the LV potential, or whether the component/line in question does not generate a corresponding current flow in the event of an excessively high voltage at the first LV potential as a result of a component part (of an interface of an LV component or of an LV component itself) or a fuse burning out or blowing.

The current flow through the voltage limiting circuit can also be identified on the basis of a potential change rate that is above a predetermined value. The potential change rate indicates the extent to which the charge of the Cy capacitances (parasitic capacitances or dedicated filter capacitors) is reversed when the current flows. The predetermined value, on the basis of which the current flow is identified, is in particular above a value that occurs at the maximum potential change rate during active insulation measurement. In particular, the potential change rate is the rate at which the voltage between one of the HV potentials changes with respect to the ground potential over time. In this case, the predetermined value can be at least 100 volts/ms, 500 volts/ms, 100 volts/ms or at least 100 volts/µs. According to the method provided here, no current flow is identified if the potential change rate is below the predetermined value.

Alternatively or in combination with this, the current flow can be identified by the magnitude of the potential difference that results from the change, i.e. the potential difference that results after the change. This corresponds to the steady-state case of the potential change, i.e. the potential difference after the potential change. The current flow can therefore be identified on the basis of a change to a potential difference between the HV potential and the ground potential. The current flow is identified when the resulting potential difference is below a predetermined value. This potential difference is preferably detected while the voltage between the HV potentials is within a normal range. In this case, the normal range corresponds, for example, to the standard operating voltage. In this case, the predetermined value can be, for example, a maximum of 60 volts, 50 volts, 30 volts or 20 volts, in particular a maximum of 20 volts or 16 volts. In one exemplary embodiment, the predetermined value is approximately 60 volts, 50 volts or 40 volts or else 20 V or 16 V. The predetermined value is preferably below the minimum value that occurs during an active insulation measurement.

One embodiment provides for the shift to be identified by means of an insulation monitor or by means of at least one voltmeter, which are part of the insulation monitor or are connected to the latter.

Provision may be made for the insulation monitor to also carry out an active insulation test of the HV on-board electrical system branch. This is carried out by actively reversing the charge of or discharging (or charging) Cy capacitances between ground on the one hand and the HV potentials on the other hand. The Cy capacitances can be composed of parasitic capacitances and dedicated filters, as are used in EMC filters, for example. Since the level of the Cy capacitances is essentially known, the likewise known current of the active charge reversal or discharging results in a potential change rate (between ground on the one hand and at least one HV potential on the other) which is characteristic of the insulation resistance. The active insulation test is therefore a test of the discharge or charging rate of the Cy capacitances when the test current is applied. The test current is preferably generated or at least controlled by an insulation monitor. The active insulation test also provides for detection of a potential shift that results from the charge reversal. This concerns a shift of an HV potential with respect to ground. Since the insulation monitor detects the potential shift of the HV potentials with respect to the ground potential, it can also be used to identify a current flow through the voltage limiting circuit.

A further aspect is that the active charge reversal or discharging is interrupted by the insulation monitor when a current flow through the voltage limiting circuit is identified. In this case, the current flow can be identified in particular by means of a potential shift that results from the current flow through the voltage limiting circuit. In this case, it is possible to use at least one voltmeter that is also used for the active insulation test of the insulation monitor, or it is possible to use at least one voltmeter that is not evaluated by the insulation monitor.

A potential difference between one of the HV potentials and the ground potential preferably does not drop below a minimum voltage during the active charge reversal. This applies in particular to their magnitudes. The minimum voltage for an HV on-board electrical system branch with a nominal voltage of 800 V is, for example, at least 60 V or 100 V. The minimum voltage caused by the active insulation test is at least 7%, 8%, 10% or 15% of the nominal voltage of the HV on-board electrical system. The current flow through the voltage limiting circuit is preferably identified on the basis of a change to a potential difference between the HV potential and the ground potential that is below a predetermined value. In particular, this value is smaller than the minimum voltage. In the case of an HV on-board electrical system branch with a nominal voltage of 800 V, this value is, for example, a maximum of 15 volts, 16 volts, 20 volts or 25 volts, possibly also 30 volts or 40 volts or 50 volts (in particular less than 60 volts). The range from which the minimum voltage is selected is above the range from which the predetermined value is selected.

In other words, although the charge is reversed (concerning the Cy capacitors) by the insulation monitor during the active insulation resistance measurement and the minimum voltage can result, the active insulation measurement does not result in a voltage value that would be relevant for detecting a current flow through the voltage limiting circuit (=predetermined value). Rather, when a current flows through the voltage limiting circuit (or element), a current flows that results in a potential difference that is smaller (roughly by a predetermined margin) than the minimum voltage that occurs in the usual active insulation resistance measurement (for short: insulation measurement). This allows the different measurements to be distinguished and different types of error can also be output, namely a first error if the voltage value is below the predetermined value and a second error if the insulation resistance measurement results in a resistance value which is below a resistance limit value.

Provision can be made for the current flow through the voltage limiting circuit to be identified by measuring at least one voltage between the at least one of the HV potentials on the one hand and the ground potential on the other hand. In this case, use is made of at least one voltmeter that is connected to the insulation monitor or is part of it. Alternatively, it is possible to use at least one voltmeter that is evaluated by its own evaluation circuit. This voltmeter has no direct signal-transmitting connection to the insulation monitor. In other words, provision may be made for the voltmeter used here to not be evaluated by the insulation monitor.

Therefore, if a potential difference that results from the current flow through the voltage limiting circuit is determined, this can be carried out by at least one voltmeter and its own evaluation circuit connected to it, which are at least logically separate from the insulation monitor. The voltmeter in question and the evaluation circuit hereby form an autonomous unit that is provided, for example, within a high-voltage housing in which other components of the high-voltage on-board electrical system branch are also present, for example HV switches and/or an HV storage battery, possibly also an HV voltage converter and/or an HV charging circuit.

At least one of the following measures can be carried out if the insulation fault is identified by identifying a current flow through the voltage limiting element. As a measure, provision may be made for a high-voltage storage battery of the HV on-board electrical system branch to be disconnected from the remaining HV on-board electrical system branch by means of circuit breakers. Provision can also be made for at least one Cy capacitor of the HV on-board electrical system branch to be disconnected, in particular the Cy filter capacitors of an inverter and/or a traction motor. Alternatively or additionally, provision may be made, as a measure, for a charging post connected to the HV on-board electrical system to be disconnected. Provision can also be made for the HV on-board electrical system branch to be discharged (in particular to ground potential) as a measure. Finally, as a measure, provision may be made for an HV on-board electrical system sub-branch to be disconnected from an inverter HV on-board electrical system sub-branch. In this case, the inverter HV on-board electrical system sub-branch has the traction inverter. This can be provided in particular by disconnecting the inverter HV on-board electrical system sub-branch. The inverter HV on-board electrical system sub-branch has the traction inverter and/or an electric machine that is used for traction of the vehicle.

If, for example, a Cy filter capacitor is disconnected when an insulation fault is detected, this results in a poorer EMC filter property. However, the disconnection avoids excessively high contact voltages.

Provision can be made for the voltage limiting circuit (or element), the current flow of which is identified, to be connected between the ground potential and the first LV potential that normally carries a positive supply potential of the LV on-board electrical system or a signal potential. The current flow through the voltage limiting element can be identified by detecting a current flow through the element itself or through a supply line that leads to the element or away from it.

An LV device can be connected to the ground potential and to a positive supply potential of the LV on-board electrical system branch. This connection can be provided via a first connection side. In addition, at least one line can be connected for example to another connection side, for example to a (data) interface of the LV device, wherein this line may have the first LV potential (or a potential that differs from ground). One or more (signal) lines can be connected to this side. By way of example, this can be a signal line, a sensor line, a communication line or a control line. The voltage limiting circuit can be connected between a ground potential and a conductor of the line. By way of example, this can be the conductor of a signal line, a communication line or a control line. The line to which the voltage limiting circuit is connected is not necessarily a positive LV potential in the sense of a positive supply potential, but can be a signal line, for example.

The LV device can be an LV communication apparatus, for instance a CAN bus circuit, or an LV sensor apparatus, for example a temperature, current or voltage measuring unit. Furthermore, the LV device can be an LV control device. In this case, the line or the LV potential to which the voltage limiting circuit is connected can be a control line or a conductor that is part of a control line.

Finally, the voltage limiting element, the current flow of which is measured, or the voltage limiting elements, the current flows of which are measured, can have a varistor, a gas discharge tube, a spark gap, a protective diode, a thyristor circuit, a DIAC, a Zener diode and/or a four-layer diode or can be provided by such a component. The voltage limiting circuit or element is generally configured to conduct above a limit voltage (=breakdown voltage) and not to conduct below a limit voltage. Therefore, the current flow indicates an excessive voltage, that is to say a voltage that is above the limit voltage or breakdown voltage. The components mentioned can also, in any combination, form the voltage limiting element.

The voltage limiting circuit can be connected between the ground potential and a (first) LV potential and can be connected via a fuse to that section of the LV on-board electrical system branch in which a low-voltage storage battery is located. This allows the fuse to blow if the insulation is defective, while the voltage limiting circuit continues to provide a current flow due to the reduced insulation resistance, which current flow can be detected and used to output a fault. The fuse then serves to protect the LV device and in particular the interface of the LV device that is connected via the fuse.

An on-board electrical system can also be provided that is configured to carry out the method, in particular by virtue of the on-board electrical system being configured to detect an insulation fault in the vehicle on-board electrical system, having an HV on-board electrical system branch and an LV on-board electrical system branch, and the LV on-board electrical system branch having a first LV potential and a second potential, wherein the second potential corresponds to a ground potential of the vehicle on-board electrical system. The HV on-board electrical system branch has a positive HV potential and a negative HV potential that are DC-isolated from the potentials of the LV on-board electrical system branch. The on-board electrical system is also configured to detect an insulation fault between at least one of the HV potentials and the first LV potential by identifying a current flow through a voltage limiting element of a voltage limiting circuit, wherein the on-board electrical system has such a voltage limiting circuit. In this case, the first LV potential is connected to a voltage limiting element via a plurality of diodes D. The voltage limiting element is connected to the ground potential (GND) of the vehicle on-board electrical system.

A vehicle overvoltage protective circuit is equipped with a ground connection and a plurality of LV potential connections. The potential connections are connected to the ground connection via a respective center connection of different diode half-bridges of the overvoltage protective circuit and via two voltage limiting elements (connected downstream of the diode half-bridges). First ends of the diode half-bridges are connected to one another and are connected to the ground connection via a first one of the two voltage limiting elements. Second ends of the diode half-bridges that are opposite thereto are connected to one another and are connected to the ground connection via a second one of the two voltage limiting elements. As a result, overvoltages that are present at the LV potential connections with respect to the ground connection are applied to the same two voltage limiting elements via different diode half-bridges.

In other words, the vehicle overvoltage protective circuit has at least one first LV potential (signal potential) and first LV potential that is in the form of the ground connection. A diode rectifier circuit is provided with a number of AC connections that at least corresponds to the number of first LV potentials. Each first LV potential is connected to a dedicated AC connection of the diode rectifier circuit. The diode rectifier circuit has a positive and a negative rail, that is to say two potentials of a DC side of the diode rectifier circuit. A first potential thereof is connected to the ground connection via a first voltage limiting element. A second potential thereof is connected to the ground connection via a second voltage limiting element. A measuring apparatus that is configured to directly or indirectly detect a current flow through one of the voltage limiting elements can be provided as part of the circuit.

The vehicle overvoltage protective circuit is used to generate a current flow in the event of overvoltage at one of the first potentials of the LV on-board electrical system branch. The overvoltage is reduced by the current flow itself, meaning that the current flow already represents a protective measure. Furthermore, the vehicle overvoltage protective circuit can be used to generate a current flow in a targeted manner that then can be detected directly or indirectly in order to detect the current flow and therefore the cause thereof: an insulation fault.

A vehicle on-board electrical system is equipped with an HV on-board electrical system and an LV on-board electrical system. The HV on-board electrical system or at least lines or components (for example HV power components) thereof are arranged in a housing. Further lines or components of the LV on-board electrical system, for example signal lines or LV components such as control, communication or sensor elements or lines, are also arranged in the housing. The LV lines or LV components serve, for example, to monitor or control an HV component (or HV line) within the housing or to communicate with an HV component within the housing. The vehicle on-board electrical system has a vehicle overvoltage protective circuit and/or is configured to implement the method described here. The vehicle on-board electrical system can also have a voltage limiting circuit that is connected between an LV ground potential and at least one first LV potential. The voltage limiting circuit connects the first LV potential to a voltage limiting element via a plurality of diodes.

The voltage limiting element is connected to the ground potential of the vehicle on-board electrical system. The voltage limiting element connects at least some of the diodes to the ground potential. As a result, a plurality of first LV signals can be protected by means of the diodes, wherein, in the event of overvoltage, there is dissipation to ground via the same voltage limiting element. An apparatus that is configured to directly or indirectly detect a current flow through a voltage limiting element can also be provided. When a current flow is determined, this apparatus is configured to output an insulation fault signal, for example to indicate an insulation fault, or to initiate a protective measure.

Furthermore, the on-board electrical system can have apparatus features that are mentioned in the context of the method described here, and the on-board electrical system can be configured to implement the method features described here.

BRIEF DESCRIPTION OF THE DRAWINGS

The FIGURE serves to explain the method described here in more detail and shows an on-board electrical system circuit provided for carrying out the method.

DETAILED DESCRIPTION

The FIGURE shows a vehicle on-board electrical system FB having an HV on-board electrical system branch HB that is accommodated in a housing G. There is also an LV on-board electrical system branch LB. Said LV on-board electrical system branch can be connected to the HV on-board electrical system branch HB via a DC-isolating voltage converter (not shown). Lines of the LV on-board electrical system branch LB lead into the housing G. As a result of insulation faults, represented by the resistances RF, RF', one of the LV lines or LV potentials thereof (1-5) can be connected to one of the HV potentials HV− or HV+. As a result, one of the LV potentials 1-5 carries an HV potential. Without the circuit SG, this can remain undetected, since the HV on-board electrical system branch is not related to the ground potential GND of the LV on-board electrical system branch, in particular if LV devices that are connected to the lines do not allow current flow in the direction of ground, for example if input stages thereof have burnt out. The fault can therefore remain undetected and/or persist. The LV potentials 1-5 are also referred to as first LV potentials. The ground potential GND of the LV on-board electrical system branch LV is also referred to as second LV potential.

A voltage limiting circuit SG is provided in order to prevent an insulation fault (or an HV potential via this insulation fault RF, RF') from propagating into one of the first LV potentials (1-5).

If there is an insulation fault in the form of an associated resistance RF, RF', the positive HV potential HV+ (for resistance RF) or the negative HV potential HV− is connected to one of the first potentials 1-5 via this faulty insulation resistance and thus to a conductor or a line that belongs to the LV on-board electrical system branch and can lead to further LV components (that are not insulated in accordance with HV guidelines). As a result, further components of the LV on-board electrical system can also be loaded with one of the HV potentials HV+, HV−. This leads to possibly dangerous contact voltages on further LV components.

The voltage limiting circuit SG is used to generate a current flow I, I' in a targeted and predictable manner when an HV potential (HV+, HV−) crosses over into the LV on-board electrical system LB via the insulation fault RF. The current I, I' in question can, for example, be detected at a point indicated with an X or the current detection can involve a current that is flowing at the point X. The point X is provided between a voltage limiting element V and ground potential GND or between one of the voltage limiting elements V and a network of diodes D.

Each of the first LV potentials 1-5 is connected, via a dedicated rectifying half-bridge, to a voltage limiting element V, V' that leads to ground GND. The diodes form a dedicated half-bridge for each of the LV potentials. Each half-bridge comprises two diodes D connected via a connecting point. These connecting points form an AC side of a rectifier circuit that is provided by the diodes. Each connecting point and therefore each diode half-bridge is connected to another LV potential or another LV conductor. Different half-bridges are connected to different LV potentials or conductors that in particular lead into the housing G in which the HV on-board electrical system branch is provided. The opposite ends of the half-bridges are connected to two different DC voltage rails (one positive, one negative). Each of the two DC voltage rails is connected to the ground potential GND via a dedicated voltage limiting element V, V'. The overvoltages are collected via the diodes and, depending on the polarity with respect to GND, connected to one of the two voltage limiting elements V, V' shown.

In other words, the diodes D form a multi-phase full-wave rectifier (in the sense of a BnU circuit, wherein n=double the phase number of the rectifier), wherein each phase of the full-wave rectifier is connected to a different LV conductor. The number of voltage limiting elements V can be greatly reduced as a result, since overvoltages are pooled via the diodes D. The circuit SG is used as an overvoltage protective circuit. Alternatively or additionally, this circuit SG can be used to bring about a defined, reliable current flow in the presence of an insulation fault RF, RF' in the HV on-board electrical system branch HB in the direction of ground GND. As a result, in accordance with the method, this current flow can be detected directly or indirectly so as to therefore identify an insulation fault. The current flow through the element V can be detected by detecting a current at the points X. The voltage between ground GND and at least one of the HV potentials HV+, HV− is preferably considered, however, on the basis of which the current flow becomes apparent. The connection arises from the fact that a current flow through element V leads to a potential shift of the potentials HV−, HV+ with respect to GND, wherein the voltage between GND and HV+ or between GND and HV− therefore reflects the current flow or the causative insulation fault. A voltmeter that is configured to detect such a voltage and to evaluate it in accordance with the method can be provided in the on-board electrical system FB in the FIGURE. This voltmeter can be part of an insulation monitoring system that is configured to carry out an active insulation resistance measurement (HV+, HV− with respect to GND). Apparatuses that are configured to carry out one of the measures described here if an insulation fault is detected can be provided in the on-board electrical system FB in the FIGURE.

The lines that carry the potentials 1-5 can be LV supply lines or communication lines (for example of a CAN bus) or a sensor line, for example for carrying a crash signal, or a maintenance signal that indicates that, for maintenance purposes, HV lines have to be disconnected.

The housing is preferably a metal housing (in general: an electrically conductive housing). The metal housing is preferably grounded.

The invention claimed is:

1. A method for detecting an insulation fault in a vehicle on-board electrical comprising:
   an HV on-board electrical system branch; and
   an LV on-board electrical system branch,
   wherein the LV on-board electrical system branch has at least one first LV potential and a second LV potential that differs therefrom and that corresponds to a ground potential of the vehicle on-board electrical system, and
   the HV on-board electrical system branch has a positive HV potential and a negative HV potential that are DC-isolated from the potentials of the LV on-board electrical system branch,
   the method comprising detecting an insulation fault between at least one of the HV potentials and the first LV potential by identifying a current flow through a voltage limiting circuit that is connected between the ground potential and the first LV potential and that connects the first LV potential, via a plurality of diodes, to a voltage limiting element that is connected to the ground potential of the vehicle on-board electrical system.

2. The method as claimed in claim 1, wherein the current flow is identified by detecting a current flow through the voltage limiting element.

3. The method as claimed in claim 1, wherein the current flow is identified by detecting a current flow through the voltage limiting element of the voltage limiting circuit, wherein the plurality of diodes thereof comprise at least two diodes that connect the at least one first LV potential to the voltage limiting element in opposing directions.

4. The method as claimed in claim 1, wherein the current flow is identified by detecting a current flow through the voltage limiting circuit, wherein a first voltage limiting element is connected to a plurality of first LV potentials via a plurality of first diodes, a second voltage limiting element is connected to the plurality of first LV potentials via a plurality of second diodes, the first diodes are connected to the ground potential in one direction and the second diodes are connected to the ground potential in a direction opposite thereto.

5. The method as claimed in claim 1, wherein the current flow is identified on the basis of a shift of one of the HV potentials with respect to the ground potential or a potential change rate of one of the HV potentials with respect to the ground potential that is above a predetermined value, or wherein the current flow is identified on the basis of a change to a potential difference between the HV potential and the ground potential that is below a predetermined value, wherein this potential difference occurs while the voltage between the HV potentials is within a normal range.

6. The method as claimed in claim 5, wherein the shift, the potential change rate or the change to the potential difference is identified by an insulation monitor.

7. The method as claimed in claim 6, wherein at least one of the following measures is carried out if the insulation fault is identified by identifying a current flow through the voltage limiting circuit:
    disconnecting a high-voltage storage battery of the HV on-board electrical system branch from the remaining HV on-board electrical system branch (HB) by circuit breakers;
    disconnecting at least one Cy filter capacitor of the HV on-board electrical system;
    disconnecting a charging post connected to the HV on-board electrical system;
    discharging the HV on-board electrical system branch;
    disconnecting an HV on-board electrical system sub-branch from an inverter HV on-board electrical system sub-branch that has a traction inverter, or wherein the insulation fault is detected by an insulation monitor, wherein said insulation monitor carries out an active insulation test of the HV on-board electrical system branch by actively reversing the charge of Cy capacitances between the ground potential on the one hand and the HV potentials on the other hand and detecting a potential shift caused by the charge reversal, wherein the active charge reversal of the insulation monitor is interrupted when a current flow through the voltage limiting circuit is identified.

8. The method as claimed in claim 5, wherein at least one of the following measures is carried out if the insulation fault is identified by identifying a current flow through the voltage limiting circuit:
    disconnecting a high-voltage storage battery of the HV on-board electrical system branch from the remaining HV on-board electrical system branch by circuit breakers;
    disconnecting at least one Cy filter capacitor of the HV on-board electrical system;
    disconnecting a charging post connected to the HV on-board electrical system;
    discharging the HV on-board electrical system branch;
    disconnecting an HV on-board electrical system sub-branch from an inverter HV on-board electrical system sub-branch that has a traction inverter, or wherein the insulation fault is detected by an insulation monitor, wherein said insulation monitor carries out an active insulation test of the HV on-board electrical system branch by actively reversing the charge of Cy capacitances between the ground potential on the one hand and the HV potentials on the other hand and detecting a potential shift caused by the charge reversal, wherein the active charge reversal of the insulation monitor is interrupted when a current flow through the voltage limiting circuit is identified.

9. The method as claimed in claim 1, wherein the voltage limiting circuit, the current flow of which is identified, is connected between the ground potential and the at least one first LV potential that is formed by a communication line, control line or sensor line.

10. The method as claimed in claim 1, wherein the voltage limiting element of the voltage limiting circuit, the current flow of which is measured, comprises a varistor, a gas discharge tube, a spark gap, a protective diode, a thyristor circuit, a DIAC, a Zener diode and/or a four-layer diode.

11. A vehicle overvoltage protective circuit having a ground connection and a plurality of LV potential connections,
    wherein the LV potential connections are connected to the ground connection via a respective center connection of different diode half-bridges of the overvoltage protective circuit and via two voltage limiting elements,
    wherein first ends of the diode half-bridges are connected to one another and are connected to the ground connection via a first one of the two voltage limiting elements and second ends of the diode half-bridges that are opposite thereto are connected to one another and are connected to the ground connection via a second one of the two voltage limiting elements, with the result that overvoltages that are present at the LV potential connections with respect to the ground connection are applied to the same two voltage limiting elements via different diode half-bridges.

* * * * *